United States Patent
Grayson et al.

(10) Patent No.: US 11,417,817 B2
(45) Date of Patent: Aug. 16, 2022

(54) FLEXIBLE WOVEN THERMOELECTRIC FABRICS FOR THERMAL MANAGEMENT

(71) Applicant: Northwestern University, Evanston, IL (US)

(72) Inventors: Matthew Grayson, Evanston, IL (US); Ramille Shah, Hinsdale, IL (US); Jun Peng, Evanston, IL (US); Adam Jakus, Chicago, IL (US); Nicholas Geisendorfer, Chicago, IL (US)

(73) Assignee: Northwestern University, Evanston, IL (US)

( * ) Notice: Subject to any disclaimer, the term of this patent is extended or adjusted under 35 U.S.C. 154(b) by 101 days.

(21) Appl. No.: 16/970,867

(22) PCT Filed: Mar. 7, 2019

(86) PCT No.: PCT/US2019/021086
§ 371 (c)(1),
(2) Date: Aug. 18, 2020

(87) PCT Pub. No.: WO2019/173553
PCT Pub. Date: Sep. 12, 2019

(65) Prior Publication Data
US 2020/0381607 A1    Dec. 3, 2020

Related U.S. Application Data
(60) Provisional application No. 62/640,193, filed on Mar. 8, 2018.

(51) Int. Cl.
*H01L 35/32* (2006.01)
*A41D 1/00* (2018.01)
(Continued)

(52) U.S. Cl.
CPC .............. *H01L 35/32* (2013.01); *A41D 1/002* (2013.01); *D03D 1/0088* (2013.01);
(Continued)

(58) Field of Classification Search
CPC ......... H01L 35/32; H01L 35/26; A41D 1/002; D03D 1/0088; D03D 15/00
See application file for complete search history.

(56) References Cited

U.S. PATENT DOCUMENTS

2008/0029146 A1    2/2008   Plissonnier et al.
2008/0287022 A1    11/2008  Dhawan et al.
(Continued)

FOREIGN PATENT DOCUMENTS

WO    WO2007/141890 A1    2/2007
WO    WO2015/081996 A1    6/2015
(Continued)

OTHER PUBLICATIONS

Peng et al., Abstract from 2018 Fall Meeting & Exhibit "Thermoelectrics and Organic Polymers Toward Applications in Wearable Devices", A meeting of the Materials Research Society, Nov. 25-30, 2018.
(Continued)

*Primary Examiner* — Tae-Sik Kang
(74) *Attorney, Agent, or Firm* — Bell & Manning, LLC

(57) ABSTRACT

Woven flexible thermoelectric fabrics are provided. The fabric is a woven material that includes a series of longitudinal threads interwoven with a series of transverse threads. Within the longitudinal series, the threads have a repeating thread pattern of an n-type thermoelectric thread, a p-type thermoelectric thread, and an insulating thread. Within the transverse series, the threads have a repeating thread pattern of a first double-sided thread with conducting side down and insulating side up, a second double-sided thread with conducting side down and insulating side up, and a third
(Continued)

double-sided thread with conducting side up and insulating side down.

17 Claims, 2 Drawing Sheets

(51) Int. Cl.
  D03D 1/00       (2006.01)
  H01L 35/26      (2006.01)
  H01L 35/34      (2006.01)
  D03D 15/283     (2021.01)
  D03D 15/50      (2021.01)
(52) U.S. Cl.
  CPC .......... *D03D 15/283* (2021.01); *D03D 15/50* (2021.01); *H01L 35/26* (2013.01); *H01L 35/34* (2013.01); *D10B 2401/16* (2013.01); *D10B 2501/04* (2013.01)

(56) References Cited

U.S. PATENT DOCUMENTS

| | | |
|---|---|---|
| 2009/0025774 A1 | 1/2009 | Plissonnier et al. |
| 2010/0205920 A1 | 8/2010 | Czubarow et al. |
| 2012/0227778 A1 | 9/2012 | Leonov |
| 2013/0174884 A1 | 7/2013 | Grayson et al. |
| 2015/0311421 A1 | 10/2015 | Jur et al. |
| 2016/0079509 A1 | 3/2016 | Grayson et al. |

FOREIGN PATENT DOCUMENTS

| | | | |
|---|---|---|---|
| WO | WO2017/059392 A1 | 4/2017 | |
| WO | WO-2017059392 A1 * | 4/2017 | ............. H01L 35/16 |

OTHER PUBLICATIONS

Peng et al., Abstract from 2018 Spring Meeting & Exhibit "3D-Printed Thermoelectric Threads", A meeting of the Materials Research Society, Apr. 2-6, 2018.
Sun et al., "Flexible unipolar thermoelectric devices based on patterned poly[Kx(ni-ethylenetetrathiolate)] thin films," Adv. Mater. 2016, 28, 3351-3358, Jul. 2017.
Yang et al., "Transparent flexible thermoelectric material based on non-toxic earth-abundant p-type copper iodide thin film," Nature Communications, Jul. 6, 2017, 7 pages.
Lee et al., "Woven-yarn thermoelectric textiles," Australian Institute for Innovative Materials—Papers, 2016, 9 pages.
Miller et al., "Polycrystalline $ZrTe_5$ Parametrized as a Narrow-Band-Gap Semiconductor for Thermoelectric Performance," Physical Review Applied 9, 2018, pp. 014025- to 014025-11.
Vatansever et al., "Smart Woven Fabrics in Renewable Energy Generation," Advances in Modern Woven Fabrics Technology, 2001 InTech, Available from: http://www.intechopen.com/books/advances-in-modernwoven-fabrics-technology/smart-woven-fabrics-in-renewable-energy-generation.
Kim et al., "3D printing of shape-conformable thermoelectric materials using all-inorganic $Bi_2Te_3$-based inks" Nature Energy, vol. 3, Apr. 2018, pp. 301-309.
Wang et al., "Thermoelectric and mechanical properties or PLA/$Bi_{0.5}Sb_{1.5}Te_3$ composite wires used for 3D printing" Composites Science and Technology 157 (2018) 1-9.
Choi et al., "Large Voltage Generation of Flexible Thermoelectric Nanocrystal Thin Films by Finger Contact," Adv. Energy Mater. 2017, 7, pp. 1700972-1700978.
Dun et al, "Layered $Bi_2Se_3$ Nanoplate/Polyvinylidene Fluoride Composite Based n-type Thermoelectric Fabrics," ACS Appl. Mater. Interfaces 2015, 7, 7054-7059.
Gowthaman et al., "A Review on Energy Harvesting Using 3D Printed Fabrics for Wearable Electronics" J. Inst. Eng. India Ser.C. (Aug. 2018) 99(4): 435-447.
International Search Report and Written opinion for PCT/US2019/021086, dated May 9, 2019.

* cited by examiner

FLEXIBLE WOVEN THERMOELECTRIC FABRICS FOR THERMAL MANAGEMENT

CROSS-REFERENCE TO RELATED APPLICATIONS

This application is a National Stage of International Application No. PCT/US19/21086, filed Mar. 7, 2019, which claims the benefit of U.S. Patent Application No. 62/640,193, filed Mar. 8, 2018, the contents of which are herein incorporated by reference.

REFERENCE TO GOVERNMENT RIGHTS

This invention was made with government support under HR0011-17-1-0005 awarded by the Defense Advanced Research Projects Agency (DARPA) and under FA9550-15-1-0377 awarded by the Air Force Office of Scientific Research (AFOSR). The government has certain rights in the invention.

BACKGROUND

Waste heat can be harvested to power many applications, including internet-of-things devices and sensors that can have very low power requirements. Although standard rigid thermoelectrics are commercially well known for their reliability and application in energy harvesting and refrigeration or heating, they have little relevance for flexible applications. Moreover, conventional thermoelectrics require multi-step device processing, their assembly can be expensive, and their device size is typically restricted to between 1 cm and 10 cm. Given that only low powers may be required, novel platforms for waste heat recovery that are conformable and flexible can satisfy an important technological need even if the efficiency is low.

SUMMARY

Woven thermoelectric fabrics are provided. One embodiment of a thermoelectric fabric is a woven material that includes: a series of longitudinal threads, the series of longitudinal threads having a repeating thread pattern comprising an n-type thermoelectric thread, a p-type thermoelectric thread, and an insulating thread; and a series of transverse threads that are interwoven with the longitudinal threads, the series of transverse threads having a repeating thread pattern comprising a first double-sided thread comprising an electrically conductive bottom surface and an oppositely facing insulating top surface, a second double-sided thread comprising an electrically conductive bottom surface and an oppositely facing insulating top surface, and a third double-sided thread comprising an electrically conductive top surface and an oppositely facing insulating bottom surface.

The first double-side thread is interwoven with the longitudinal threads such that it provides an electrically conductive path between the p-type thermoelectric threads, but not between the n-type thermoelectric threads. The second double-sided thread is interwoven with the longitudinal threads such that it provides an electrically conductive path between the n-type thermoelectric threads, but not between the p-type thermoelectric threads. The third double-sided thread is interwoven with the longitudinal threads such that it provides an electrically conductive path between the n-type thermoelectric threads and the p-type thermoelectric threads.

BRIEF DESCRIPTION OF THE DRAWINGS

Illustrative embodiments of the invention will hereafter be described with reference to the accompanying drawings, wherein like numerals denote like elements.

FIG. 1, panel (a) shows powders of the thermoelectric semiconductor $Bi_2Te_3$ produced by high-energy ball milling suspended in polymer (FIG. 1, panel (b)) to form thermoelectric 3D-paints. FIG. 1, panel (c) shows inks extruded out through a nozzle at room temperature, which are dry upon extrusion and are collected around a spindle.

DETAILED DESCRIPTION

Woven thermoelectric fabrics for thermal management applications and methods for making the woven thermoelectric fabrics are provided. Functionalities that can be provided by the fabrics include energy harvesting, active cooling, active heating, and being able to switch from an energy harvesting mode to an active cooling/heating mode for multi-functional applications. The fabrics are flexible, durable, and light-weight. Therefore, they are well-suited for use as wearable textiles, such as those in cooling jackets and wearable battery chargers. In particular, the thermoelectric textiles can satisfy the low power requirements of the internet-of-things (IOT), and, therefore, can power the next generation IOTs using ambient heat sources. Other thermal management applications for the fabrics include powering portable sensors, detectors, and processors using electrical energy generated from waste heat.

Once fabricated, the woven thermoelectric fabrics can be incorporated into a variety of articles of clothing or other textiles, including shirts, pants, hats, jackets, and blankets for wearables; or into wraps or adhesive tapes for energy harvesting from industrial applications such as warm pipes, conduits, or heat exchanger blocks.

Figures 2A, 2B:
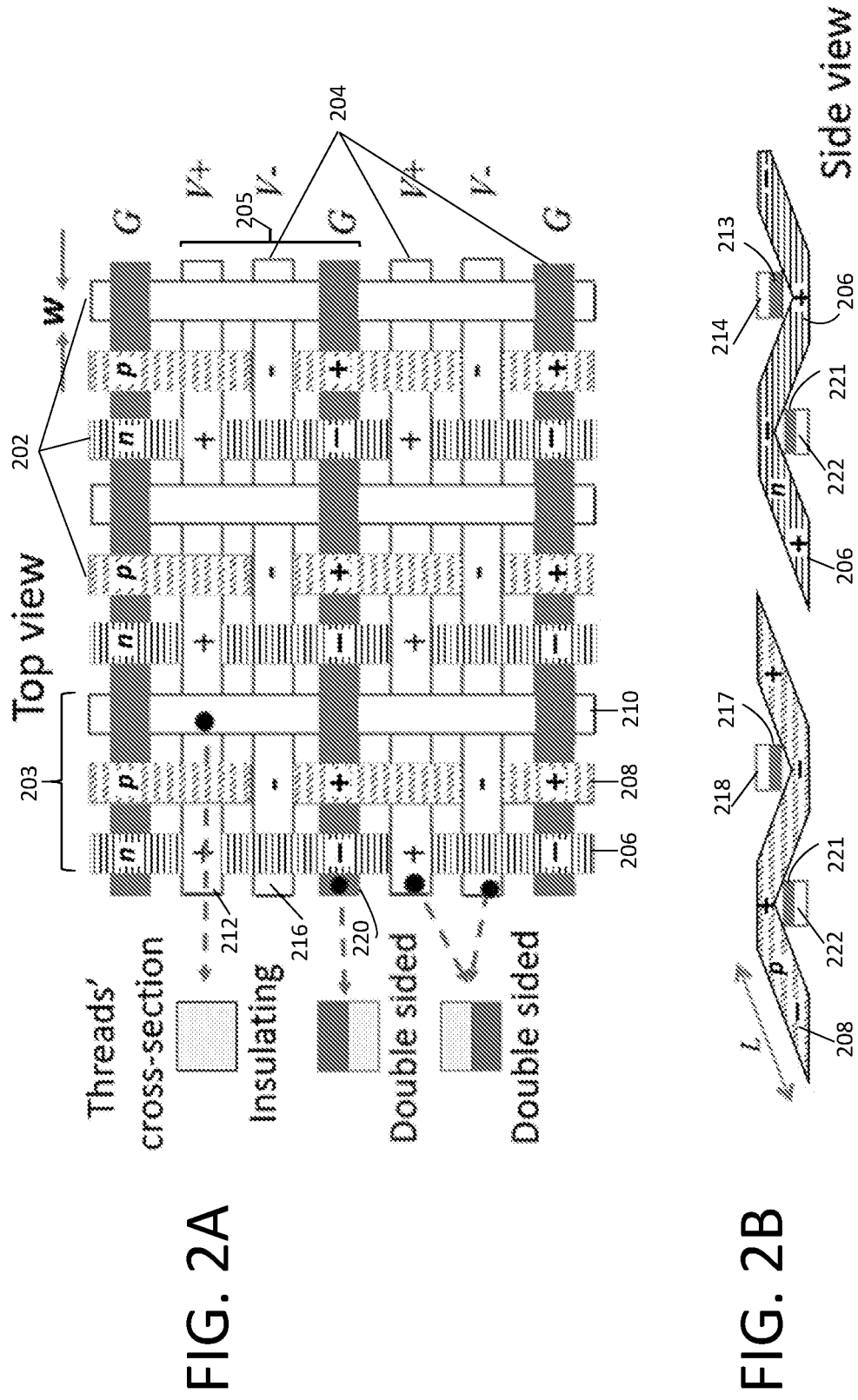
FIGS. 2A and 2B depict a top view (FIG. 2A) and side view (FIG. 2B) of a thermoelectric fabric. p-type thermoelectric threads in the weave have a positive potential (+) when woven above to the upper (cold) side of the fabric and negative potential (−) when woven below to the lower (hot) side of the fabric. The n-type thermoelectric threads have the opposite polarity. Cross-woven voltage lines V+ and V− connect parallel p-n thermocouples within the fabric. The V+ line electrically connects all of the hot sides of the n-type legs of the p-n thermocouples; the ground lead G electrically connects all of the cold sides of the n-type legs of the p-n thermocouples to the cold sides of the p-type legs; and the V− line electrically connects all of the hot sides of the p-type legs of the p-n thermocouples. The V+, V−, and G threads are double-sided having a thermally and electrically insulating side running alongside an electrically conductive side. The thermally and electrically insulating side of the double-sided thread can maintain the temperature difference between hot and cold sides of the fabric.

One embodiment of a thermoelectric fabric is shown in FIG. 2A (top view) and FIG. 2B (cross-sectional side view). The fabric is a woven material that includes a series of longitudinal threads 202 interwoven with a series of transverse threads 204. Within the longitudinal series, the threads have a repeating thread pattern 203 comprising an n-type thermoelectric thread 206, a p-type thermoelectric thread 208, and an electrically and thermally insulating thread 210, hereafter referred to as an insulating thread. It should be understood that this repeating thread pattern can be read from either side of the fabric (e.g., from left to right, as shown in FIG. 2A, or from right to left). Thus, if the positions of the p-type thermoelectric threads and the n-type thermoelectric threads in FIG. 2A were switched, the resulting fabric would still have a repeating thread pattern comprising an n-type thermoelectric thread, a p-type thermoelectric thread and an insulating thread. Within the transverse series of threads, the threads have a repeating thread pattern 205 comprising a first double-sided thread 212 having an electrically conductive bottom surface 213 and an oppositely facing insulating top surface 214, a second double-sided thread 216 having an electrically conductive bottom surface 217 and an oppositely facing insulating top surface, 218 and an upside-down double-sided thread 220 having an electrically conducting top surface 221 and an oppositely facing insulating bottom surface 222. Here again, the repeating thread pattern for the series of transverse threads may be read from either side of the fabric.

In the fabric, first double-sided thread 212 is woven through longitudinal threads 202 such that its electrically conductive surface 213 forms a continuous electrically conductive path between n-type thermoelectric threads 206, while is insulating surface 214 acts as an electrical and thermal insulator between p-type insulating threads 208. Similarly, second double-sided thread 216 is woven through longitudinal thread 202 such that its electrically conductive surface 217 forms a continuous electrically conductive path between p-type thermoelectric threads 208, while its insulating surface 218 acts as an electrical and thermal insulator between n-type insulating threads 206.

The fabrics can be made using highly scalable woven fabric production, such as looms, which can provide low manufacturing costs for large-scale production. For example, a plain weave-type pattern, of the type shown in FIG. 2A can be carried out using a loom. The weave is characterized by a warp direction, where the warp threads stay stationary on a frame during weaving, and a weft direction, where the weft threads are drawn through the warp threads during weaving. It should be understood that, for a loom-fabricated woven fabric, the longitudinal threads referred to herein can be the warp threads or the weft threads and the transverse threads can be the corresponding weft threads or warp threads. The terms longitudinal and transverse are used merely to indicate that the two sets of threads have crosswise orientation in the fabric; they typcially have a perpendicular or substantially perpendicular orientation with respect to one another.

The thermoelectric fabrics are characterized in that they are able to convert a temperature difference into electrical power. Therefore, the thermoelectric fabrics can be used to power an electrical device connected across the fabric. The temperature difference can arise from a variety of sources. For example, a fabric in contact with, or near, a wearer's skin can have a higher temperature at the side facing the skin than at the side facing away from the skin. Similarly, a fabric having one side facing a heat source, such as the sun, will have a higher temperature at that side than at the side facing away from the heat source. When a temperature difference is created across the fabric, charge carriers (holes for p-type materials and electrons for n-type materials) in the p-type and n-type threads migrate from the warmer side to the cooler side, thereby generating an electrostatic potential.

In the fabric of FIG. 2A, the p-type thermoelectric threads have a positive potential (+) when woven above to the cold side and negative potential (−) when woven below to the hot side of the fabric. The n-type thermoelectric treads have the opposite polarity. Cross-woven voltage lines V+ and V− connect parallel p-n thermocouple weaves.

The thread dimensions in the fabrics are not particularly limited, provided they are consistent for woven fabric formation. By way illustration only, the threads may have cross-sectional dimensions (i.e., width, w, and thickness, t) in the range from 0.01 mm to 2 mm and lengths exceeding several meters.

The threads that make up the fabrics can be made from a variety of materials having the appropriate electrical and thermal properties. By way of illustration, the insulating threads can be made from insulating organic polymers, insulating particles (e.g., ceramics), or insulating particles dispersed in an insulating polymer matrix; the electrically conductive threads can be made from metals, electrically conductive oxides, electrically conductive polymers, or electrically conductive particles in a polymer matrix. Metal-like conducting threads with low-work functions are preferred to minimize contact resistance at metal-to-semiconductor (thermoelectric) thread ohmic contacts. The polymer matrix for an electrically conductive thread can be an electrically conductive polymer or a non-electrically conductive polymer. However, in the latter case, the loading of electrically conductive particles in the thread should be sufficiently high to provide a percolation path for the conduction of an electric current. By way of further illustration, the n-type and p-type thermoelectric threads can be formed from conducting n-type and p-type thermoelectric polymers, conducting n-type and p-type thermoelectric particles, or conducting n-type and p-type thermoelectric particles dispersed in a polymer matrix. The polymer matrix for the thermoelectric threads can be an electrically conductive polymer or a non-electrically conductive polymer. However, in the latter case, the loading of electrically conductive thermoelectric particles in the thread should be sufficiently high to provide a percolation path for the conduction of an electric current.

The use of threads composed of particles dispersed in a polymer matrix may be advantageous because such threads can be formed as continuous, robust, mechanically flexible threads having good electrical or thermoelectrical properties that can be woven without significantly altering their electrical resistance or thermoelectric performance. 3D extrusion printing is a method for forming such threads with high particle loadings using self-solidifying "inks", as illustrated in the Examples. Post-extrusion, the threads can be sintered and/or compressed to improve their electrical conductivity. Compression to form threads having a flat ribbon-like geometry is useful because it maximizes overlapping surface areas in the weave and minimizes contact resistance for effective device performance.

3D extrusion printing can be used to form the double-sided threads via side-by-side coextrusion of an electrically conductive thread and an insulating thread, followed by compression to form a flattened double sided-thread (i.e., a double-sided "ribbon"). This can be accomplished, for example, by coextrusion of an electrically insulating composition and an electrically conductive composition using a commercially available needle with two inlets and one outlet and controlling of viscosities of the two materials to make a double-layered structure, which is then mechanically pressed through rollers.

Examples of thermoelectric materials that can be used in the n-type or p-type thermoelectric threads include organic and inorganic materials. For example, p-type or n-type thermoelectric polymers, p-type or n-type thermoelectric inorganic semiconductors, or a combination thereof can be used. The thermoelectric threads can be constructed from these materials. Alternatively, thermoelectric materials may be dispersed as particles in a matrix of another material, such as a polymer, or may be applied as a coating on the thread. An illustrative example of a thermoelectric polymer is poly(3,4-ethylenedioxythiophene):poly(styrenensulfonate) (PEDOT:PSS). Illustrative examples of inorganic thermoelectric semiconductors include p-type or n-type or p-type bismuth telluride-based alloys and solid solutions. However, other thermoelectric materials can be used.

Examples of electrically conductive materials that can be used in the electrically conductive half of the double-sided threads include metals, conductive carbon-based materials, electrically conducting oxides and polymers, and combinations thereof. The electrically conductive side of the double-sided threads can be constructed from these materials. Alternatively, these materials may be dispersed as particles in a matrix of another material, such as a polymer, or may be applied as a coating on the thread. For example, a coating of a metal can be applied to the surface a thread by electroplating or evaporation. Illustrative examples of electrically conducting particles include carbon nanotubes and silver nanowires. However, other material can be used.

Examples of insulating materials that can be used in the insulating threads and the insulating side of the double-sided threads include bulk polymers, ceramics, rubber threads, cotton threads, glass micro-beads composites, and Kapton. The insulating threads and the insulating side of the double-sided threads can be constructed from these materials. Alternatively, these materials may be dispersed as particles in a matrix of another material, such as a polymer, or may be applied as a coating on the thread. On way of fabricating a double-sided thread is to apply a coating of an electrically conductive material, such as a metal, onto one side of an insulating thread.

The thread can be made using a variety of methods and can have a variety of cross-sectional shapes. For example, polymer threads can be made by simply cutting a film of a suitable plastic into thin strips or the electrically conducting side of a double-sided thread can be made by cutting a metal foil into thin strips and laminating a metal strip onto the surface an insulating substrate. Other methods of making the threads include 3D extrusion printing and molding.

Some embodiments of threads used in the thereomoelectric fabrics are composed of particles (e.g., p-type thermoelectric particles, n-type thermoelectric particles, electrically conductive particles, or insulating particles) dispersed in a polymeric matrix. 3D extrusion printing is one useful technique for making such composite threads.

Examples of polymer compositions, including suitable polymers and solvents, to which particles can be added to form 3D extrusion printable compositions are described in PCT application publication number WO2015/175880, the disclosure of which is incorporated herein by reference. By way of illustration only, the 3D extrusion printable compositions can include a graded solvent that includes a primary organic solvent that has a high vapor pressure and therefore evaporates rapidly at room temperature and atmospheric pressure (101.3 kPa). The solvent system may further include one or more additional organic solvents having lower vapor pressures than the primary solvent at room temperature. Suitably high vapor pressures at room temperature and atmospheric pressure include those in the range from about 20 kPa to about 60 kPa, which includes those in the range from about 25 kPa to about 55 kPa.

Some embodiments of the solvent systems comprise dichloromethane (DCM) as a primary solvent, which may be used in combination with one or more additional organic solvents. The use of DCM is advantageous because, upon extrusion of the ink composition, DCM, which is a very high volatility solvent, evaporates very rapidly, leaving a solid, continuous thread. Chloroform is another example of a suitable primary organic solvent. The primary solvent is the majority solvent in the solvent system. That is, it accounts for at least 50% by volume (vol. %) of the solvents in the solvent system. In some embodiments, the primary organic solvent accounts for at least 70 vol. % of the solvent system. This includes embodiments in which primary organic solvent accounts for at least 90 vol. % of the solvent system.

Any additional organic solvents desirably have vapor pressures that are lower than that of DCM at the desired printing or deposition temperature (e.g., room temperature—about 23° C.). As a result, the additional organic solvents evaporate more slowly over time but permit adjacent layers to merge together during deposition, resulting in a single, monolithic structure with strong interlayer adhesion and fidelity. Some embodiments of the solvent systems comprise an additional solvent that is a surfactant, an additional solvent that is a plasticizer, or a combination of at least two additional solvents—one of which is a surfactant and the other of which is a plasticizer. 2-butoxyethanol (2-Bu) and dibutylphthalate (DBP) are examples of additional organic solvents that may be included in the solvent system. In solvent systems comprising DBP, the DBP acts as a plasticizer. However, other organic plasticizers can be used in place of, or in combination with, the DBP. In solvent systems comprising 2-Bu, the 2-Bu acts as a surfactant. However, other organic surfactants can be used in place of, or in combination with, the 2-Bu.

The elastic polymers in the 3D extrudable compositions (also referred to as ink compositions) that include such polymers provide a binder that helps to hold the particles together in the final printed or deposited object, film, or coating. The elastic polymers are characterized by the property of elasticity. The elastic polymers should be soluble or substantially soluble in the solvent system at the intended printing temperature but are desirably insoluble or substantially insoluble in water at the intended printing temperature or a higher temperature. The elastic polymer may comprise, for example, a polyester, a polymethacrylate, a polyacrylate, a polyethylene glycol, or a combination of two or more thereof. Examples of suitable polyester polymers that can be included in the ink compositions are polylactic acid (PLA), glycolic acid, copolymers of PLA and glycolic acid (i.e., polylactic-co-glycolic acid (PLGA)), and polycaprolactone (PCL). Some embodiments of the ink compositions comprise blends of one or more of these polyesters with other polyesters or with one or more non-polyester elastomeric polymers.

Only small quantities of the elastic binder are needed to provide extruded threads that are flexible, strong and elastic. For example, some embodiments of the 3D extrudable compositions comprise no greater than about 50 vol. % binder, based on the solids content of the ink composition. This includes ink compositions that comprise no greater than about 40 vol. %, no greater than about 20 vol. %, and no greater than about 10 vol. % of the polymer binder, based on the solids content of the ink compositions. (Note: because the non-solids content of the ink compositions (the solvents) eventually evaporate from structures formed from the ink compositions, the values for the vol. % based on solids content of the ink compositions also reflect the total vol. % for the final structures.)

Some embodiments of the 3D extrudable compositions and, therefore, the threads and woven fabrics formed from the compositions, are characterized by high particle loadings. For example, some embodiments of the compositions have a solid particle content of at least 50 vol. % based on the solids content of the composition. This includes embodiments of the compositions that have a solid particle content of at least 60 vol. %, at least 80 vol. %, and at least 90 vol. %, based on the solids content of the composition.

The compositions can be made simply by mixing the solvents of the solvent system, the binder polymers, and the solid particles with excess primary solvent (for example, DCM) and allowing the primary solvent to evaporate until the ink composition has achieved a viscosity suitable for extrusion. This process can be conducted at room temperature and under atmospheric conditions. Suitable viscosities will depend on the 3D extrusion printing equipment (e.g., printer nozzle diameter). By way of illustration only, some embodiments of the 3D extrudable compositions have a viscosity in the range from about 25 Pa·s to about 40 Pa·s at room temperature.

EXAMPLES

Example 1

Fabrication of p-type and n-type Thermoelectric Threads

Both n-, p-type thermoelectric threads and double-sided half-conducting-half-insulating thread were fabricated in air ambient by extruding 3D-extudable compositions ("paints") made from thermoelectric semiconductor powders (e.g., $Bi_2Te_3$) and conducting fillers embedded in a polymer matrix. Post-compression of the extruded threads was employed to improve the electrical conductivity by 7 orders, due to the enhanced intimate contacts between thermoelectric powders. Therefore, the material figure of merit is still desirable taking consideration of both relatively low electrical conductivity and thermal conductivity. This fabrication process can be used to produce a zero-$CO_2$ emission technology to harvest waste energy.

Figure 1:
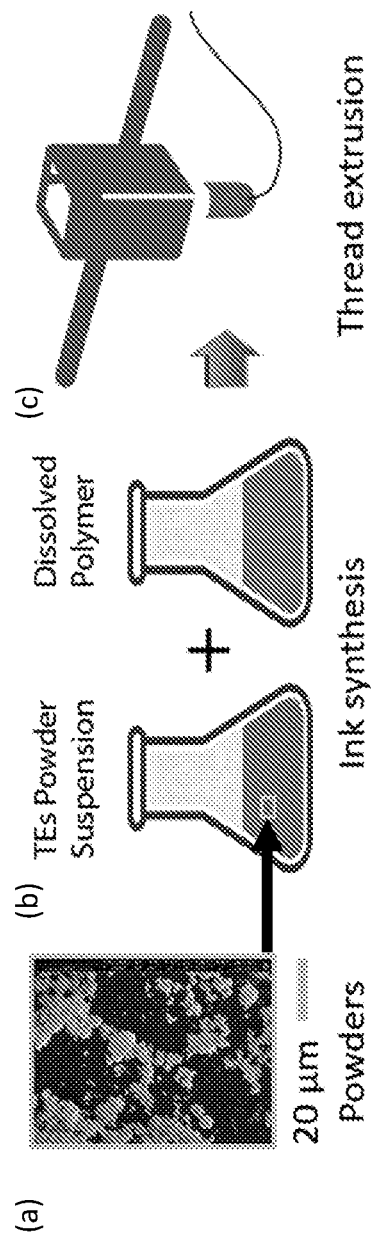
FIG. 1 (panels (a)-(c)) depicts the fabrication of thermoelectric threads by three-dimensional (3D) extrusion printing.

Two functional thermoelectric threads were fabricated: p-type thermoelectric threads and n-type thermoelectric threads. To create the threads, $Bi_2Te_3$ crystals were grown and ball-milled, and the resulting powder was added to a polymer base to make a 3D-extrudable composition. Threads were extruded in air ambient, with rollers to compress to ribbons. Subsequently, the ribbons were spooled and woven into a textile. Transport properties of threads were compared to pure bulk thermoelectrics. FIG. 1, panels (a)-(c) show the thread fabrication procedure.

These threads yielded a power density factor p=7.2 $nW/cm^2K^2$, meaning that $\Delta T=5°$ C. degrees of temperature difference through a patch of fabric with area $A=10\times10$ $cm^2$ would generate $P=pAT^2=18$ μW of electrical power. Thread dimensions for the experimentally fabricated threads were w=0.4 mm, L=8 cm, and thickness t=0.09 mm. It Higher power densities can be achieved using other thread processing techniques and/or materials.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A thermoelectric fabric comprising a woven material comprising:
   a series of longitudinal threads, the series of longitudinal threads having a repeating thread pattern, the repeating thread pattern comprising an n-type thermoelectric thread, a p-type thermoelectric thread, and an insulating thread; and
   a series of transverse threads that are interwoven with the longitudinal threads, the series of transverse threads having a repeating thread pattern, the repeating thread pattern comprising a first double-sided thread comprising an electrically conductive bottom surface and an oppositely facing insulating top surface, a second double-sided thread comprising an electrically conductive bottom surface and an oppositely facing insulating top surface, and a third double-sided thread comprising an electrically conductive top surface and an oppositely facing insulating bottom surface,
   wherein the first double-sided threads in the series of transverse threads provide[s] electrically conductive paths between p-type thermoelectric threads in the series of longitudinal threads, but not between n-type thermoelectric threads in the series of longitudinal threads, the second double-sided threads in the series of transverse threads provide[s] electrically conductive paths between the n-type thermoelectric threads in the series of longitudinal threads, but not between the p-type thermoelectric threads in the series of longitudinal threads, and the third double-sided threads provide[s] electrically conductive paths between the n-type thermoelectric threads and the p-type thermoelectric threads in the series of longitudinal threads.

2. The fabric of claim 1, wherein the n-type thermoelectric threads in the series of longitudinal threads comprise n-type thermoelectric particles in a polymer matrix.

3. The fabric of claim 2, wherein the n-type thermoelectric particles comprise n-type bismuth telluride.

4. The fabric of claim 2, wherein the p-type thermoelectric threads in the series of longitudinal threads comprise p-type thermoelectric particles in a polymer matrix.

5. A thermoelectric fabric powered device comprising an electronic device connected across a thermoelectric fabric, such that a thermoelectric current generated by the thermoelectric fabric powers the electronic device, the thermoelectric fabric comprising a woven material comprising:
   a series of longitudinal threads, the series of longitudinal threads having a repeating thread pattern, the repeating thread pattern comprising an n-type thermoelectric thread, a p-type thermoelectric thread, and an insulating thread; and
   a series of transverse threads that are interwoven with the longitudinal threads, the series of transverse threads having a repeating thread pattern, the repeating thread pattern comprising a first double-sided thread comprising an electrically conductive bottom surface and an oppositely facing insulating top surface, a second double-sided thread comprising an electrically conductive bottom surface and an oppositely facing insulating top surface, and a third double-sided thread comprising an electrically conductive top surface and an oppositely facing insulating bottom surface, wherein the first double-sided threads provide electrically conductive paths between p-type thermoelectric threads in the series of longitudinal threads, but not between n-type thermoelectric threads in the series of longitudinal threads, the second double-sided threads provide electrically conductive paths between the n-type thermoelectric threads in the series of longitudinal threads, but not between the p-type thermoelectric threads in the series of longitudinal threads, and the third double-sided threads provide electrically conductive paths between the n-type thermoelectric threads and the p-type thermoelectric threads in the series of longitudinal threads.

6. The thermoelectric fabric powered device of claim 5, wherein the n-type thermoelectric threads in the series of longitudinal threads comprise n-type thermoelectric particles in a polymer matrix.

7. The thermoelectric fabric powered device of claim 6, wherein the n-type thermoelectric particles comprise n-type bismuth telluride.

8. The thermoelectric fabric powered device of claim 6, wherein the p-type thermoelectric threads in the series of longitudinal threads comprise p-type thermoelectric particles in a polymer matrix.

9. An article of clothing comprising: an article of clothing having a thermoelectric fabric incorporated therein, the thermoelectric fabric comprising a woven material comprising:
   a series of longitudinal threads, the series of longitudinal threads having a repeating thread pattern, the repeating thread pattern comprising an n-type thermoelectric thread, a p-type thermoelectric thread, and an insulating thread; and
   a series of transverse threads that are interwoven with the longitudinal threads, the series of transverse threads having a repeating thread pattern, the repeating thread pattern comprising a first double-sided thread comprising an electrically conductive bottom surface and an oppositely facing insulating top surface, a second double-sided thread comprising an electrically conductive bottom surface and an oppositely facing insulating top surface, and a third double-sided thread comprising an electrically conductive top surface and an oppositely facing insulating bottom surface,
   wherein the first double-sided threads provide electrically conductive paths between p-type thermoelectric threads in the series of longitudinal threads, but not between n-type thermoelectric threads in the series of longitudinal threads, the second double-sided threads provide electrically conductive paths between the n-type thermoelectric threads in the series of longitudinal threads, but not between the p-type thermoelectric threads in the series of longitudinal threads, and the third double-sided threads provide electrically conductive paths between the n-type thermoelectric threads and the p-type thermoelectric threads in the series of longitudinal threads.

10. The article of clothing of claim 9, further comprising an electronic device connected across the thermoelectric fabric, such that a thermoelectric current generated by the thermoelectric fabric powers the electronic device.

11. The article of clothing of claim 9, wherein the n-type thermoelectric threads in the series of longitudinal threads comprise n-type thermoelectric particles in a polymer matrix.

12. The article of clothing of claim 11, wherein the n-type thermoelectric particles comprise n-type bismuth telluride.

13. The article of clothing of claim 11, wherein the p-type thermoelectric threads in the series of longitudinal threads comprise p-type thermoelectric particles in a polymer matrix.

14. An adhesive tape comprising a thermoelectric fabric and an adhesive backing affixed to the thermoelectric fabric, the thermoelectric fabric comprising a woven material comprising:
   a series of longitudinal threads, the series of longitudinal threads having a repeating thread pattern, the repeating thread pattern comprising an n-type thermoelectric thread, a p-type thermoelectric thread, and an insulating thread; and
   a series of transverse threads that are interwoven with the longitudinal threads, the series of transverse threads having a repeating thread pattern, the repeating thread pattern comprising a first double-sided thread comprising an electrically conductive bottom surface and an oppositely facing insulating top surface, a second double-sided thread comprising an electrically conductive bottom surface and an oppositely facing insulating top surface, and a third double-sided thread comprising an electrically conductive top surface and an oppositely facing insulating bottom surface,
   wherein the first double-sided threads provide electrically conductive paths between p-type thermoelectric threads in the series of longitudinal threads, but not between n-type thermoelectric threads in the series of longitudinal threads, the second double-sided threads provide electrically conductive paths between the n-type thermoelectric threads in the series of longitudinal threads, but not between the p-type thermoelectric threads in the series of longitudinal threads, and the third double-sided threads provide electrically conductive paths between the n-type thermoelectric threads and the p-type thermoelectric threads in the series of longitudinal threads.

15. The adhesive tape of claim 14, wherein the n-type thermoelectric threads in the series of longitudinal threads comprise n-type thermoelectric particles in a polymer matrix.

16. The adhesive tape of claim 15, wherein the n-type thermoelectric particles comprise n-type bismuth telluride.

17. The adhesive tape of claim 15, wherein the p-type thermoelectric threads in the series of longitudinal threads comprise p-type thermoelectric particles in a polymer matrix.

* * * * *